(12) United States Patent
Lee

(10) Patent No.: US 7,939,816 B2
(45) Date of Patent: *May 10, 2011

(54) MULTI-BIT MEMORY DEVICE HAVING RESISTIVE MATERIAL LAYERS AS STORAGE NODE AND METHODS OF MANUFACTURING AND OPERATING THE SAME

(75) Inventor: Jung-hyun Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/662,102

(22) Filed: Mar. 31, 2010

(65) Prior Publication Data

US 2010/0187492 A1 Jul. 29, 2010

Related U.S. Application Data

(63) Continuation of application No. 11/278,853, filed on Apr. 6, 2006, now Pat. No. 7,718,988.

(30) Foreign Application Priority Data

Apr. 6, 2005 (KR) .......................... 10-2005-0028544

(51) Int. Cl.
*H01L 45/00* (2006.01)
*G11C 11/56* (2006.01)

(52) U.S. Cl. ........ 257/2; 257/42; 257/E45.002; 257/E45.003; 365/148

(58) Field of Classification Search .................. 257/1–5, 257/42, E29.088–E29.089, E45.001–E45.003; 365/46, 148, 159, 165; 438/102–104

See application file for complete search history.

(56) References Cited

U.S. PATENT DOCUMENTS

| 4,488,262 | A | 12/1984 | Basire et al. |
| 5,789,758 | A | 8/1998 | Reinberg |
| 5,912,839 | A | 6/1999 | Ovshinsky et al. |
| 6,507,061 | B1 | 1/2003 | Hudgens et al. |
| 6,774,387 | B2 | 8/2004 | Maimon |
| 6,809,362 | B2 | 10/2004 | Gilton |
| 6,927,410 | B2 | 8/2005 | Chen |

(Continued)

FOREIGN PATENT DOCUMENTS

EP 1355356 10/2003

(Continued)

OTHER PUBLICATIONS

Storage Element for Machine Use,. May 1, 1972, IBM Technical Disclosure Bulletin, vol. 14, Issue 12, pp. 3581-3582.

(Continued)

*Primary Examiner* — Matthew W Such
(74) *Attorney, Agent, or Firm* — Harness, Dickey & Pierce, PLC

(57) ABSTRACT

Provided are a multi-bit memory device having resistive material layers as a storage node, and methods of manufacturing and operating the same. The memory device includes a substrate, a transistor formed on the substrate, and a storage node coupled to the transistor, wherein the storage node includes: a lower electrode connected to the substrate; a first phase change layer formed on the lower electrode; a first barrier layer overlying the first phase change layer; a second phase change layer overlying the first barrier layer; and an upper electrode formed on the second phase change layer.

21 Claims, 11 Drawing Sheets

U.S. PATENT DOCUMENTS

| | | |
|---|---|---|
| 7,375,365 B2 | 5/2008 | Hsiung |
| 7,718,988 B2 * | 5/2010 | Lee .................................. 257/2 |
| 2002/0047201 A1 | 4/2002 | Suzuki |
| 2002/0131309 A1 | 9/2002 | Nishihara et al. |
| 2003/0047764 A1 | 3/2003 | Joo |
| 2003/0071289 A1 | 4/2003 | Hudgens et al. |
| 2004/0188735 A1 | 9/2004 | Hideki |
| 2004/0195603 A1 | 10/2004 | Ito |
| 2005/0002227 A1 | 1/2005 | Hideki et al. |
| 2005/0006643 A1 | 1/2005 | Lan et al. |
| 2005/0051901 A1 | 3/2005 | Chen |
| 2005/0087840 A1 | 4/2005 | Fujimori |
| 2005/0112896 A1 | 5/2005 | Hamann et al. |
| 2006/0077706 A1 | 4/2006 | Li et al. |
| 2006/0077741 A1 | 4/2006 | Wang et al. |
| 2007/0096074 A1 | 5/2007 | Asano et al. |
| 2007/0187829 A1 | 8/2007 | Lam et al. |

FOREIGN PATENT DOCUMENTS

| | | |
|---|---|---|
| EP | 1484799 | 12/2004 |

OTHER PUBLICATIONS

Richard J. Lewis, Sr., Hawley's Condensed Chemical Dictionary, 1997, John Wiley & Sons, Thirteenth Edition, p. 495.

NN72053581. "Storgae Element for Machine Use." IBM Technical Disclosure Bulletin. May 1972.

NN75053548. "Threshold Switch Protected Ferroelectric Memory." IBM Technical Disclosure Bulletin. May 1975.

Beck, A., et al. "Reproducible Switching Effect in Thin Oxide Films for Memory Applications." Appl. Phys. Lett., vol. 77, No. 1 (Jul. 3, 2000): pp. 139-141.

Hiatt, W.R. and Hickmott, T.W. "Bistable Switching in Niobium Oxide Diodes." Appl. Phys. Lett., vol. 6, No. 6 (Mar. 15, 1965): pp. 106-108.

* cited by examiner

MULTI-BIT MEMORY DEVICE HAVING RESISTIVE MATERIAL LAYERS AS STORAGE NODE AND METHODS OF MANUFACTURING AND OPERATING THE SAME

CROSS-REFERENCE TO RELATED PATENT APPLICATION

This application is continuation of U.S. application Ser. No. 11/278,853, filed Apr. 6, 2006 now U.S. Pat. No. 7,718, 988, which claims the benefit of priority under 35 U.S.C. §119 to Korean Patent Application No. 10-2005-0028544, filed on Apr. 6, 2005, in the Korean Intellectual Property Office, the disclosure of which is incorporated herein in its entirety by reference.

BACKGROUND OF THE INVENTION

1. Field of the Invention

The present invention relates to a semiconductor memory device and a method of manufacturing and operating the same, and more particularly, to a multi-bit memory device having resistive material layers as a storage node, and methods of manufacturing and operating the same.

2. Description of the Related Art

There are two types of memory: volatile memory, that loses the stored data when power is turned off, and non-volatile memory, that do not require power to retain its contents. With the advancement in Internet technology and increasing popularity of mobile communication devices, increasing attention is being directed toward non-volatile memory devices. While flash memory is now commonly used as a non-volatile memory, next-generation non-volatile memories continue to be introduced, including ferroelectric random access memory (FeRAM), magnetic RAM (MRAM), silicon-oxide-nitride-oxide-silicon (SONGS) memory, resistive RAM (RRAM), and phase change RAM (PRAM), some of which are being used for limited commercial applications.

RRAM or PRAM differs from other non-volatile memories in that it uses a resistor as a memory node. A storage node in a PRAM includes a phase change layer that changes between an amorphous and a crystalline phase according to a given condition. The. phase change layer exhibits high resistance in the amorphous state and low resistance in the crystalline state. This resistance variation in the phase change layer allows the PRAM to write and read data bits.

FIG. 1 shows a conventional PRAM having p resistive material layer as a storage node. Referring to FIG. 1, the conventional PRAM includes a field-effect transistor ('transistor') that is formed on a semiconductor substrate 10 and has a source 12, a drain 14, and a gate stack 16 containing a gate electrode. The transistor is covered by a first interlayer insulating layer 18. The first interlayer insulating layer 18 includes a first conductive plug 20 that penetrates through the first interlayer insulating layer 18 and is connected to the drain 14. The first conductive plug 20 is used as a lower electrode. A germanium-antimony-tellurium (GeSbTe, also referred to as 'GST') layer 22 is formed on the first interlayer insulating layer 18 to cover the top surface of the first conductive plug 20. The GST layer 22 is a phase change layer and is used as a memory node. An upper electrode 24 is formed on the GST layer 22, both of which are covered by a second interlayer insulating layer 26. A contact hole 28 which exposes a source 12 is formed in the first and second interlayer insulating layers. 18 and 26 and filled with a second conductive plug-30. A bit line, 32 is formed on the second interlayer insulating layer 26 and coupled to the top surface of the second conductive plug 30.

The operation of the conventional PRAM will now be described briefly.

When a phase change current is applied to the GST layer 22, a portion of the GST layer 22 changes from a crystalline state to an amorphous state. The resistance of the GST layer 22 increases after the phase change current is applied. Because the phase change current changes the resistance of the GST layer 22, a data bit 1 is considered to have been written to the GST layer 22 when the GST layer 22 has high resistance after the phase change current is applied. On the other hand, when the GST has low resistance before the phase change current is applied, a data bit 0 is considered to have been written to the GST layer 22.

In the conventional PRAM, the state of the GST layer 22 varies according to the current applied. However, the phase change current applied to change a portion of the GST layer 22 to the amorphous state poses a major challenge to improving the characteristics of PRAM. The advancement of semiconductor manufacturing technology makes it technically possible to reduce the size of PRAM by reducing the size of storage node and transistor. However, as the transistor becomes smaller, its current supply capability decreases. Thus, when the current allowed through the transistor is less than that needed to cause the phase change of the GST layer 22, the PRAM is difficult to -operate. This results in a restriction to the integration density of PRAM. Another drawback of the conventional PRAM is that it cannot write more than 2-bit data.

SUMMARY OF THE INVENTION

The present invention provides a memory device having resistive material layers as a storage node, offering high integration density and low driving voltage, and which can write at least 2-bit data.

The present invention also provides a method of manufacturing the memory device having resistive material layers as a storage node.

The present invention also provides a method of operating the memory device having resistive material layers as a storage node.

According to an aspect of the present invention, there is provided a resistive memory device including a substrate, a transistor formed on the substrate, and a storage node coupled to the transistor, wherein the storage node includes: a lower electrode connected to the substrate; a first phase change layer formed on the lower electrode; a first barrier layer overlying the first phase change layer; a second phase change layer overlying the first barrier layer; and an upper electrode formed on the second phase change layer.

The first phase change layer may be formed of a chalcogenide material or a transition metal oxide. The first barrier layer may be a metal layer or an insulating layer having a lower resistance than the first and second phase change layers and being thin enough to permit the tunneling of electrons.

The second phase change layer may be formed of a transition metal oxide or a chalcogenide material. The resistive memory device may further include a second barrier layer and a third phase change layer sequentially formed between the second phase change layer and the upper electrode. The second barrier layer is a metal layer or an insulating layer having a lower resistance than the first through third phase change layers and being thin enough to allow the tunneling of electrons. The resistive memory device may further include a dielectric layer that is formed between the second phase change layer and the upper electrode and is thin enough to allow the tunneling of electrons.

Alternatively, the storage node may include: a lower electrode connected to the substrate; a phase change layer formed on the lower electrode; a thin dielectric layer overlying the phase change layer; and an upper electrode formed on the dielectric layer. The phase change layer may be either first or second phase change layer.

According to another aspect of the present invention, there is provided a method of manufacturing a resistive memory device, including the steps of: forming a transistor including first and second impurity regions doped with conductive impurities on a substrate; forming a first interlayer insulating layer on the substrate to cover the transistor; forming a contact hole exposing one of the first and second impurity regions in the first interlayer insulating layer; filling the contact hole with a conductive plug; forming a first phase change layer on the first interlayer insulating layer to contact the conductive plug; forming a first barrier layer on the first phase change layer; forming a second phase change layer on the first barrier layer; forming a second interlayer insulating layer on the first interlayer insulating layer to cover the entire exposed surfaces of the first and second phase change layers and barrier layer; and forming an upper electrode connected to the second phase change layer on the second interlayer insulating layer.

Before forming the second interlayer insulting layer, a second barrier layer and a third phase change layer may be sequentially formed on the second phase change layer. The first through third phase change layers and the first and second barrier layers may be formed of the same materials as described for the memory device. A dielectric layer thin enough to allow the tunneling of electrons maybe further formed between the second phase change layer and the upper electrode.

Alternatively, the manufacturing method may include the steps of: forming a transistor including first and second impurity regions doped with conductive impurities on a substrate; forming a first interlayer insulating layer on the substrate to cover the transistor; forming a contact hole exposing one of the first and second impurity regions in the first interlayer insulating layer; filling the contact hole with a conductive plug; forming a phase change layer on the first interlayer insulating layer to contact the conductive plug; forming a dielectric layer thin enough to permit the tunneling of electrons on the phase change layer; and forming an upper electrode on the dielectric layer. The phase change layer may be either first or second phase change layer.

According to yet another aspect of the present invention, there is provided a method of operating a resistive memory device having a substrate, a transistor formed on the substrate, and a storage node coupled to the transistor, the storage node including a lower electrode connected to the substrate, a first phase change layer formed on the lower electrode, a first barrier layer overlying the first phase change layer, a second phase change layer overlying the first barrier layer, and an upper electrode formed on the second phase change layer, wherein a first write voltage Vw1 is applied between the upper and lower electrodes of the storage node to cause a phase change of the first phase change layer.

A second write voltage Vw2 may be applied between the upper and lower electrodes to cause a phase change of the second phase change layer, after applying the first write voltage Vw1.

In another embodiment, a method of operating a resistive memory device having a substrate, a transistor formed on the substrate, and a storage node coupled to the transistor, the storage node including a lower electrode connected to the substrate, a first phase change layer formed on the lower electrode, a first barrier layer overlying the first phase change layer, a second phase change layer overlying the first barrier layer, and an upper electrode formed on the second phase change layer, includes the step of applying a write voltage between the upper and lower electrodes of the storage node to cause a phase change of the second phase change layer.

In yet another embodiment, a method of operating a resistive memory device having a substrate, a transistor formed on the substrate, and a storage node coupled to the transistor, the storage node including a lower electrode connected to the substrate, a first phase change layer formed on the lower electrode, a first barrier layer overlying the first phase change layer, a second phase change layer overlying the first barrier layer, and an upper electrode formed on the second phase change layer, includes the step of applying a read voltage between the upper and lower electrodes of the storage node. The first and second phase change layers and the first barrier layer may be formed of the same materials as described for the memory device.

The present invention allows writing of data using a current lower than the maximum allowable current for the transistor, thereby alleviating the restriction on integration density due to the maximum allowable current for the transistor. The present invention also enables writing at least 2-bit data.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
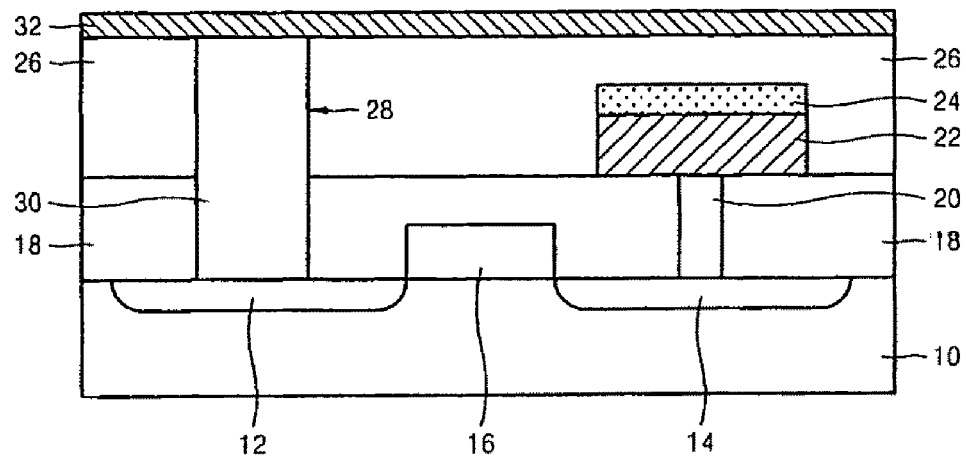
FIG. 1 is a cross-sectional view of a conventional phase change random-access memory (PRAM).

A multi-bit memory device having resistive material layers as a storage node and methods of manufacturing and operating the same according to embodiments of the present invention will now be described more fully with reference to the accompanying drawings. In the drawings, the thicknesses of layers and regions are exaggerated for clarity.

Figure 2:
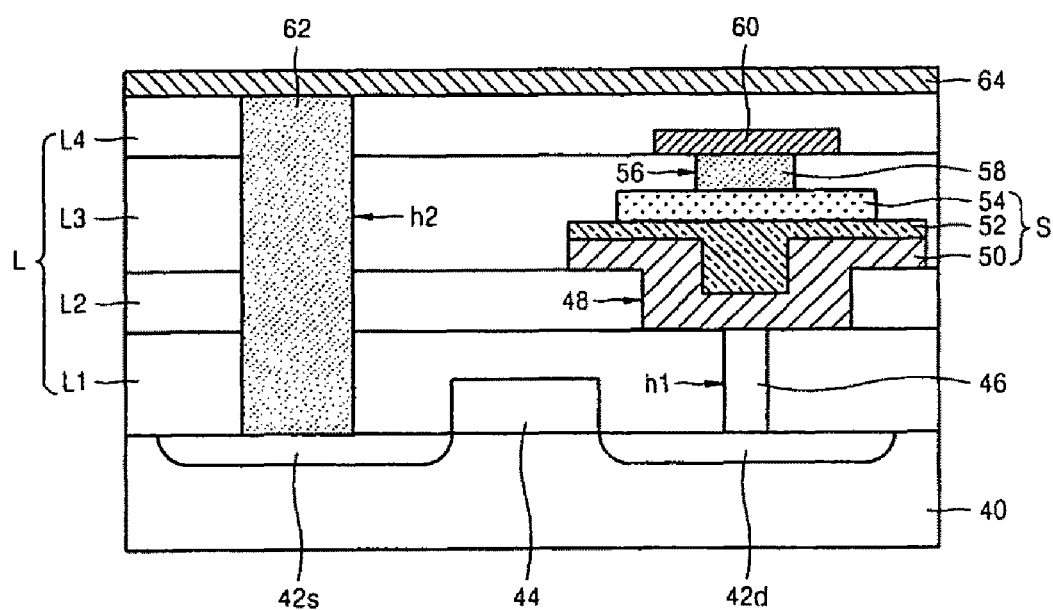
FIG. 2 is across-sectional view of a multi-bit memory device having resistive material layers as a storage node according to an embodiment of the present invention.

FIG. 2 shows the configuration of a multi-bit memory device according to an embodiment of the present invention. Referring to FIG. 2, first and second impurity regions 42$s$ and 42$d$ are formed in a substrate 40 such that the impurity regions 42$s$ and 42$d$ are doped with impurities of an opposite conductivity type to that of the substrate 40. The substrate 40 may be either p- or n-type semiconductor. The first and second impurity regions 42$s$ and 42$d$ are spaced apart from each other and used respectively as a source region and a drain region. However, the functions of the first and second impurity regions 42s and 42d any alternatively be the reverse of this. A gate stack 44 is formed on the substrate 40 between the first and second impurity regions 42s and 42l. The gate stack 44 may include a gate electrode and an insulating layer covering the sidewalls and top surface of the gate electrode. The first and second impurity regions 42s and 42d and the gate stack 44 form a field-effect transistor. A first interlayer insulating layer L1 is formed on the substrate 40 to cover the transistor. A first contact hole h1 exposing the second impurity region 42d is formed in the first interlayer insulating layer L1. The first contact hole h1 is filled with the first conductive plug 46 acting as a lower electrode. A second interlayer insulating layer L2 overlies the first interlayer insulating layer L1. A first via hole 48 exposing the top surface of the first conductive plug 46 is formed in the second interlayer insulating layer L2. The first via hole 48 has a larger diameter than the first contact hole h1. The bottom of the first via hole 48 is covered with a first phase change layer 50 covering the top surface of the first conductive plug 46. The first phase change layer 50 extends to a portion of the second interlayer insulating layer L2 surrounding the first via hole 48 along the sidewalls of the first via hole 48. The first phase change layer 50 is formed of a chalcogenide material such as germanium-antimony-tellurium (GeSbTe, also referred to as 'GST'). When a first current flows through the first conductive plug 46, a portion of the first phase change layer 50 in contact with the first conductive plug 46 undergoes a phase change from a crystalline to an amorphous state. When a second current less than the first current is applied over a given time, the amorphous portion changes back to the crystalline state. The resistance of the first phase change layer 50 in the crystalline state is hereinafter referred to as a 'first resistance' and denoted by R1. A barrier layer 52 and a second phase change layer 54 having a second resistance R2 are sequentially formed on the first phase change layer 50. The second resistance R2 refers to the minimum resistance in the variation of the resistance due to a phase change of the second phase change layer 54. The barrier layer 52 prevents holes or defects such as oxygen vacancies from moving between the first and second phase change layers 50 and 54.

For example, when the first and second phase change layers 50 and 54 are respectively a GST layer and a niobium oxide (NbO) layer, the barrier layer 52 prevents oxygen from moving from the second phase change layer 54 to the first phase change layer 50. The barrier layer 52 between the first and second phase change layers 50 and 54 can reduce the current required to cause a phase change of the first or second phase change layer 50 or 54, and fine tuning of the current is possible due to the barrier layer 52. The barrier layer 52 may be formed of a material having a third resistance R3 (<<R1, R2) that is significantly less than the first and second resistances R1 and R2 of the first and second phase change layers 50 and 54 as well as the difference R1–R2 between the first and second resistances R1 and R2. Because the resistance of the barrier layer 52 is significantly less than the first and second resistances R1 and R2, the resistance R (=R1+R2+R3) of a storage node S including the first and second phase change layers 50 and 54 and the barrier layer 52 may be considered equal to the sum of the first and second resistances R1 and R2 of the first and second phase change layers 50 and 54. The barrier layer 52 may be a metal layer made of iridium (Ir) or an insulating layer having a thickness within the range that satisfies the above resistance requirements. The second phase change layer 54 may be made of a material whose resistance varies with voltage, such as NbO, and may be separated from the first phase change layer 50. Thus, the second phase change layer 54 may not extend beyond the top surface of the barrier layer 52. The storage node S may have various other structures, for example, including two or more barrier layers and three or more phase change layers, which will be described in greater detail later.

A third interlayer insulating layer L3 is located on the second interlayer insulating layer L2 to cover the storage node S. A second via hole 56 exposing the second phase change layer 54 is formed in the third interlayer insulating layer L3. The second via hole 56 is filled with a second conductive plug 58. An upper electrode 60 is located on the third interlayer insulating layer L3 to cover the top surface of the second conductive plug 58. The upper electrode 60 lies parallel to the gate electrode of the gate stack 44. A fourth interlayer insulating layer L4 overlies the third interlayer insulating layer L3 to cover the upper electrode 60. The first through fourth interlayer insulating layers L1 through L4 are collectively called an interlayer insulating layer L. A second contact hole h2 exposing the first impurity region 42s is formed in the interlayer insulating layer L and filled with a third conductive plug 62. A bit line 64 is connected to the third conductive plug 62 and is formed perpendicular W the gate stack 44 and the upper electrode 60.

Figure 3:
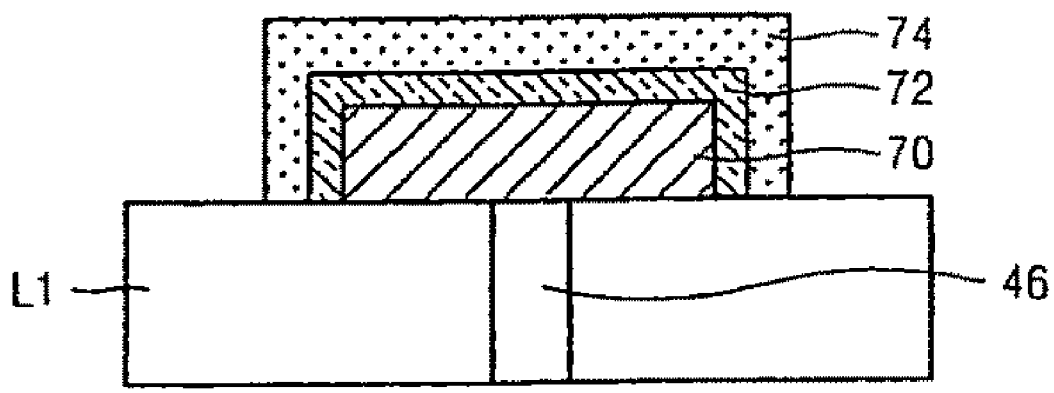
FIGS. 3-6 are cross-sectional views showing various modified examples of the storage node in the multi-bit memory device of FIG. 2.
Figure 4:
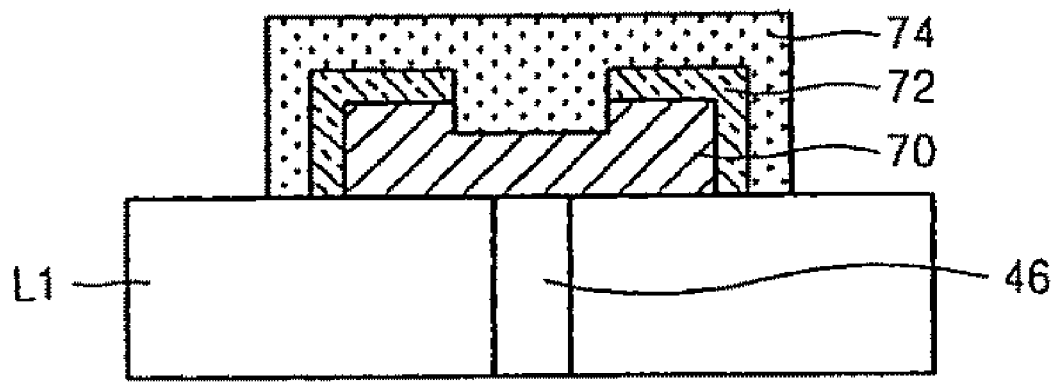

FIGS. 3-6 are cross-sectional views showing various modified examples of the storage node S in the multi-bit memory device of FIG. 2. Referring to FIG. 3, a rectangular first phase change layer 70 is located on a first interlayer insulating layer L1 to cover the top surface of a first conductive plug 46. The entire exposed surface of the first phase change layer 70 is covered by a barrier layer 72. The entire exposed surface of the barrier layer 72 is covered by a second phase change layer 74. The first phase change layer 70 may be cylindrical as shown in FIG. 4.

Figure 5:
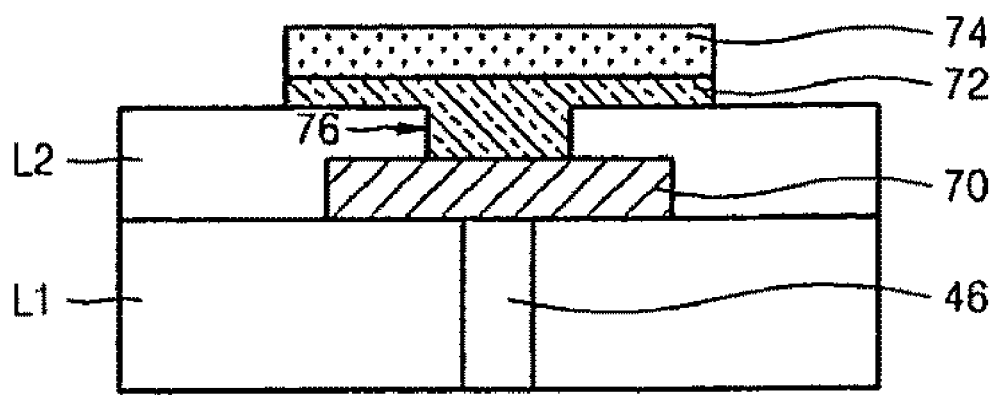

Referring to FIG. 5, a first phase change layer 70 is located on a first interlayer insulating layer L1 to cover the top surface of a first conductive plug 46. A second interlayer insulating layer L2 is located on the first interlayer insulating layer L1 to cover the entire exposed surface of the first phase change layer 70. A third via hole 76 is formed in the second interlayer insulating layer L2. A barrier layer 72 is formed on the second interlayer insulating layer L2 and fills the third via hole 76. A second phase change layer 74 overlies the barrier layer 72.

Figure 6:
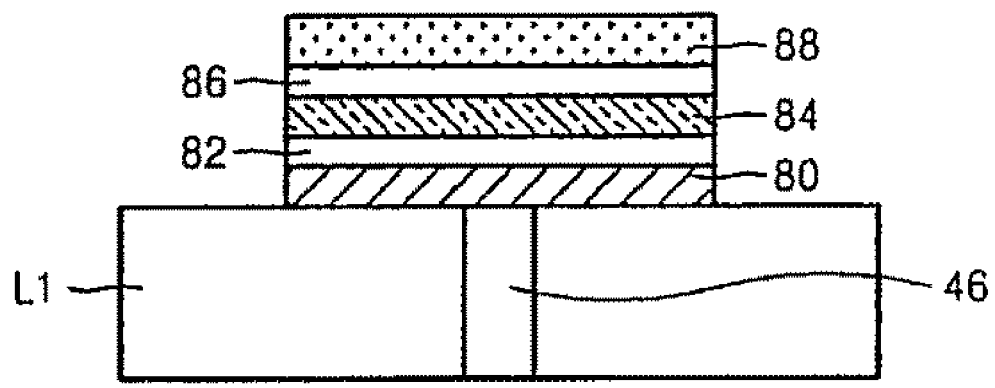

Referring to FIG. 6, a first phase change layer 80 Wormed on a first interlayer insulating layer ILI to cover the top surface of a first conductive plug 46. A first barrier layer 82, a second phase change layer 84, a second barrier layer 86, and a third phase change layer 88 are sequentially formed on the first phase change layer 80. The first and second barrier layers 82 and 86 may be made of metal such as Ir, or the barrier layers 82 and 86 may be made of an insulating material having a negligible resistance that is significantly lower than the minimum resistances of the first through third phase change layers 80, 84, and 88. To prevent the first through third phase change layers 80, 84, and 88 from contacting one another, their widths may decrease from the first to third phase change layer 88.

The storage nodes of FIGS. 2-5 may further include a dielectric layer that is formed between the barrier layer 72 and the second phase change layer 74 and is thin enough to permit the tunneling of electrons. Similarly, the storage node of FIG. 6 may further include a dielectric layer on the top or bottom surface of the first or second barrier layer 82 or 86.

Figure 7:
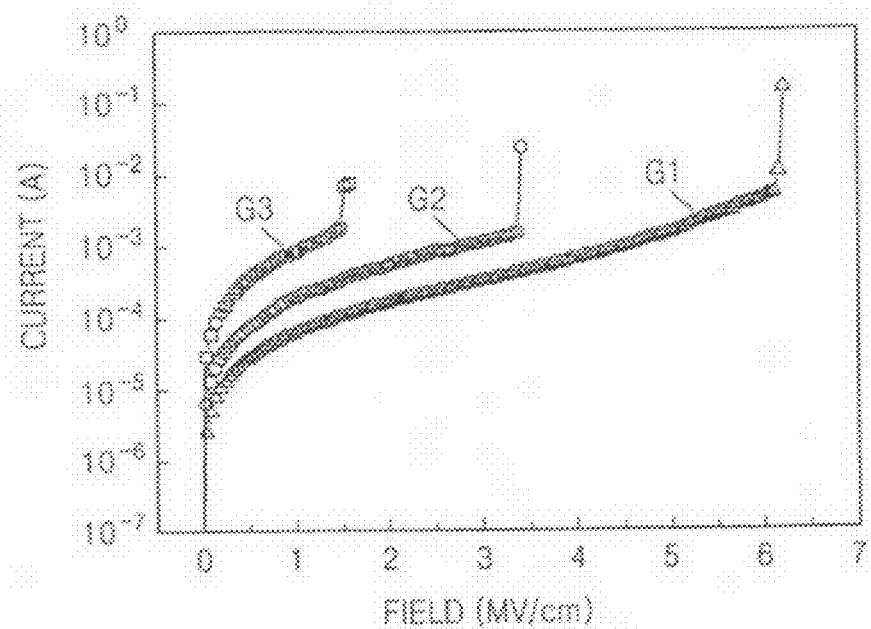
FIG. 7 is a graph of current with respect to the number of barrier layers in the storage node of the multi-bit memory device of FIG. 2.

FIG. 7 is a graph of current with respect to the number of barrier layers in the storage node S of the multi-bit memory device of FIG. 2. First through third series G1 through G3 respectively represent the current when the storage node S does not include a barrier layer, when the storage node S includes a single barrier layer, and when the storage node S includes double barrier layers. As is evident from FIG. 7, the maximum current decreases as the number of barrier layers in the storage node S increases. The current applied to the storage node S can be reduced by increasing the number of barrier layers in the storage node S. Thus, it is possible to adjust the current applied to the storage node S so as not to exceed the current rating of the transistor.

Figure 8:
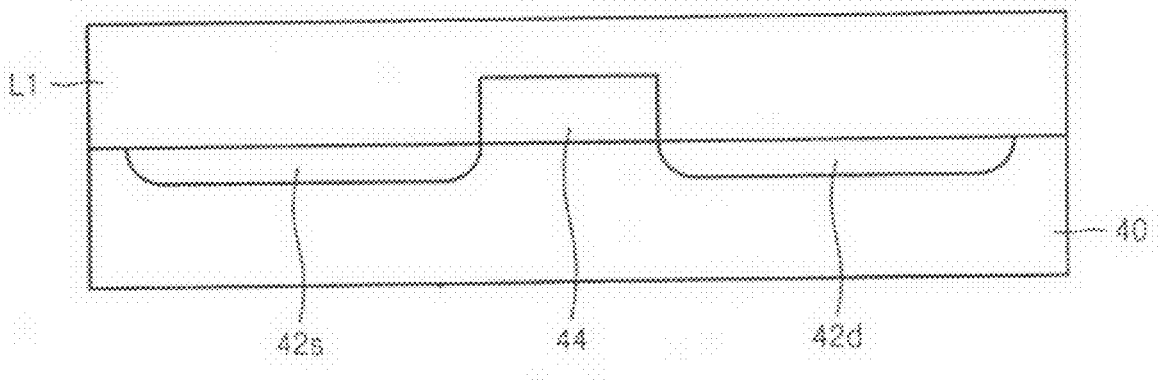
FIGS. 8-18 are cross-sectional views illustrating steps of a method of manufacturing the memory device of FIG. 2 according to an embodiment of the present invention.

FIGS. 8-18 are cross-sectional views illustrating steps of a method of manufacturing the memory device of FIG. 2 according to an embodiment of the present invention. Referring to FIG. 8, first and second impurity regions 42s and 42d and a gate stack 44 including a gate electrode are formed on a substrate 40 to create a transistor. The substrate 40 is either p- or n-type semiconductor and the first and second impurity regions 42s and 42d are doped with impurities of the opposite conductivity type to that of the substrate 40. Then, a first interlayer insulating layer L1 is formed on the substrate 40 to cover the transistor.

Figure 9:
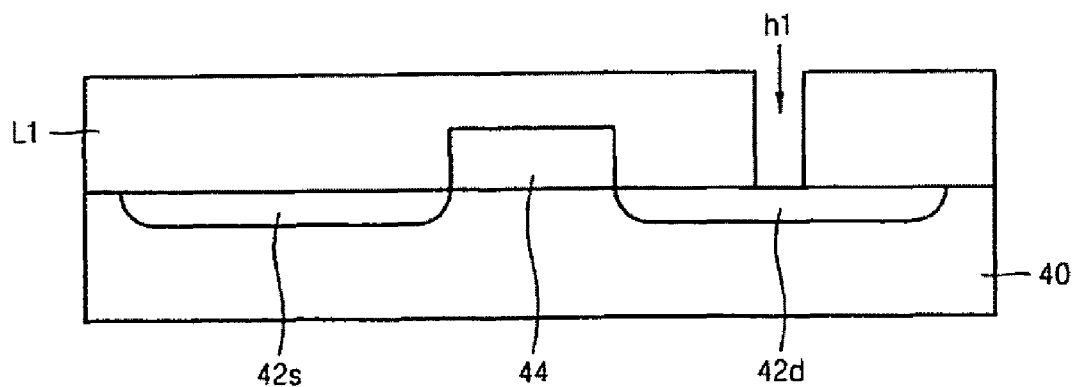
Figure 10:
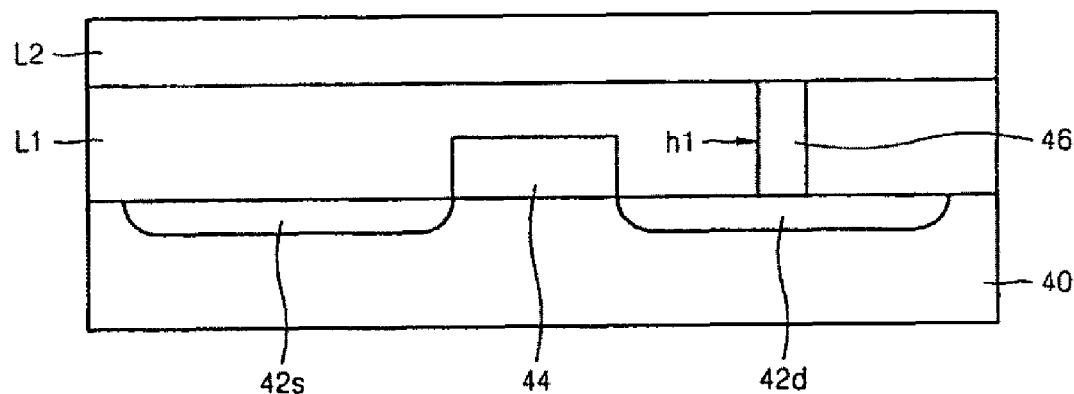

Referring to FIG. 9, a first contact hole h1 exposing the second impurity region 42d is formed in the first interlayer insulating layer L1. Subsequently, as shown in FIG. 10, the first contact hole h1 is filled with a first conductive plug 46. The first conductive plug 46 may be formed of aluminum (Al) or doped polysilicon and serves as a lower electrode. A second interlayer insulating layer L2 is formed on the first interlayer insulating layer L1 to cover the exposed top surface of the first conductive plug 46. The first and second interlayer insulating layers L1 and L2 may be integrated into a single insulating layer.

Figure 11:
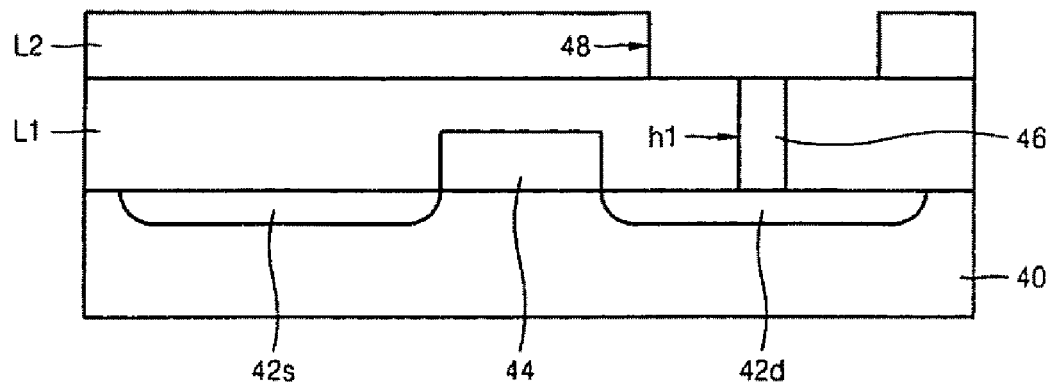

Referring to FIG. 11, photo etching is used to form a first via hole 48 exposing the top surface of the first conductive plug 46 in the second interlayer insulating layer L2. The first via hole 48 has a lager diameter than the first contact hole h1.

Figure 12:
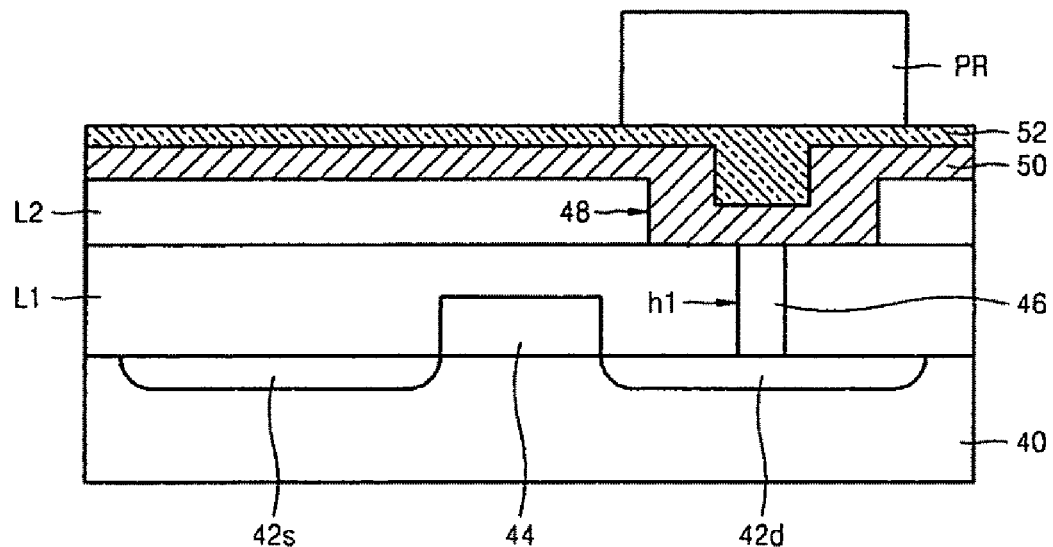
Figure 13:
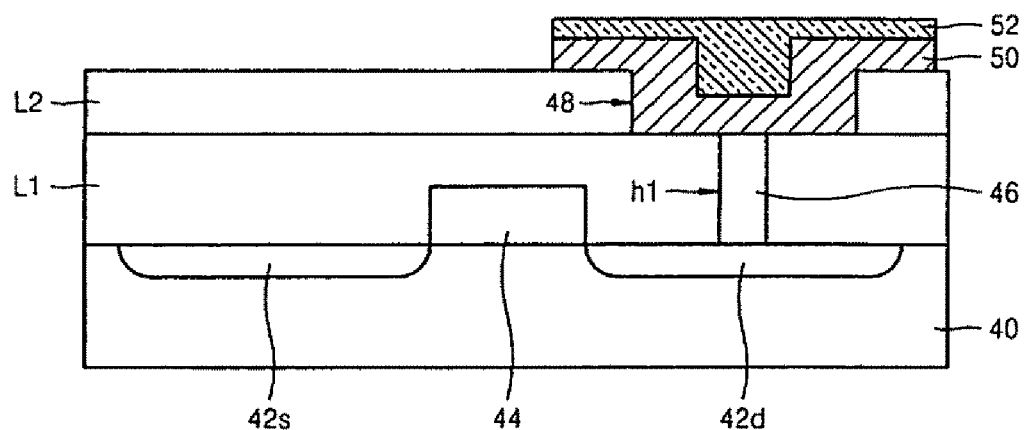

Referring to FIG. 12, a first phase change layer 50 is formed on the second interlayer insulating layer L2 and fills a portion of the first via hole 48 in such a way as to cover the bottom and sidewalls of the first via hole 48 to a predetermined thickness. Alternatively, the first phase change layer 50 may fill the entire first via hole 48. In the later case, after the first phase change layer 50 is formed on the second interlayer insulating layer L2, the surface of the first phase change layer 50 is planarized. The first phase change layer 50 may be formed of a chalcogenide material such as GST. Next, a barrier layer 52 is formed on the first phase change layer 50 and fills the remaining portion of the first via hole 48, followed by the planarization of the surface of the barrier layer 52. The barrier layer 52 may be formed of metal such as Ir or an insulating material having a significantly lower resistance than the first resistance of the first phase change layer 50 and the second resistance of a second phase change layer, which will be formed during a subsequent step, and thin enough to allow the tunneling of electrons.

A first photoresist pattern PR defining a storage node region including the first via hole 48 is formed on the barrier layer 52. The barrier layer 52 and the first phase change layer 50 are sequentially etched using the first photoresist pattern PR as an etch mask until the second interlayer insulating layer L2 is exposed. After etching, the first photoresist pattern PR is removed to give the resulting structure shown in FIG. 13.

Figure 14:
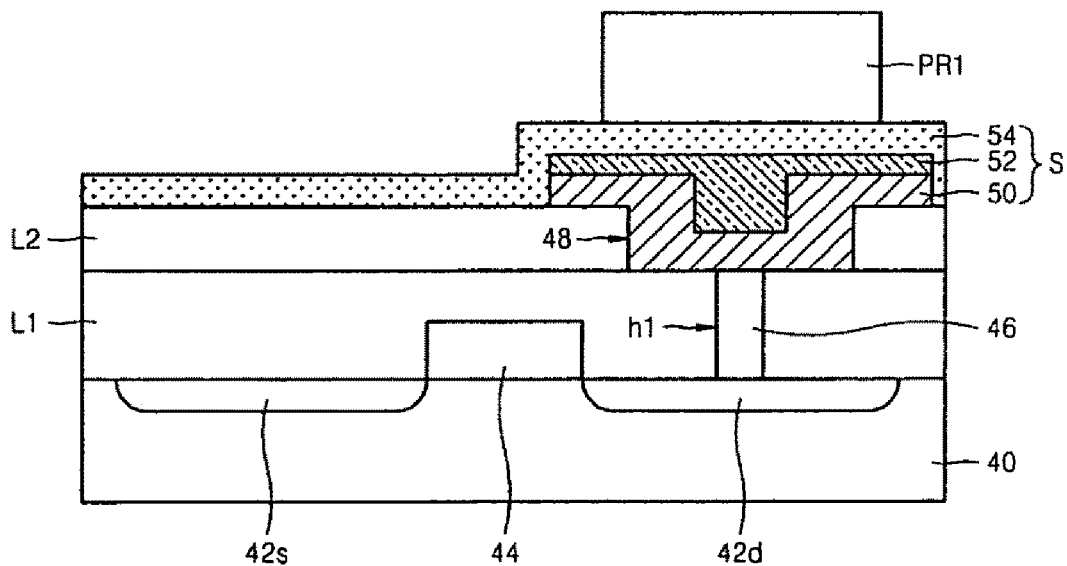
Figure 15:
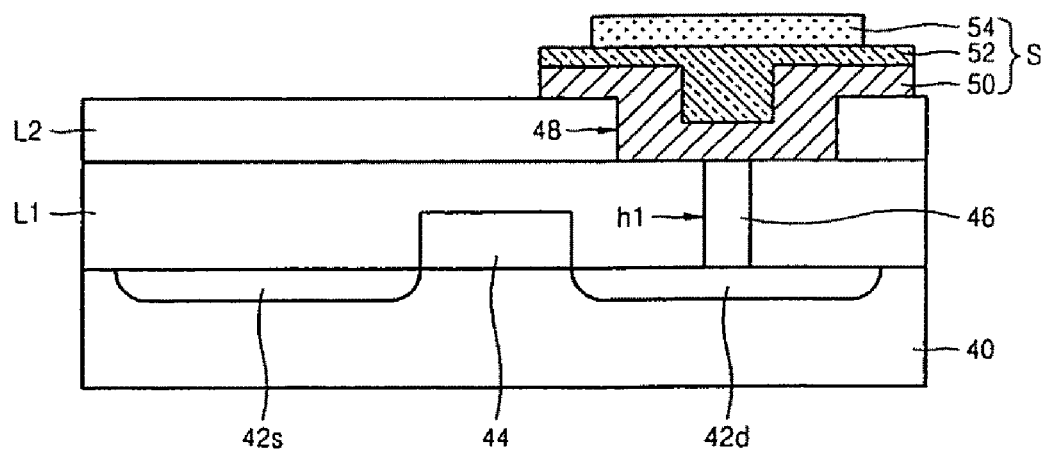

Then, referring to FIG. 14, a second phase change layer 54 is formed on the second interlayer insulating layer L2 to cover the entire exposed surface of the phase change layer 50 and the entire exposed surface of the barrier layer 52 remaining after the etching. The second phase change layer 54 may be formed of a resistive material, such as nickel oxide (NiO), having the second resistance that is significantly higher than the resistance of the barrier layer 52. A second photoresist pattern PR1 defining a portion of the barrier layer 52 is formed on the second phase change layer 54. The exposed portion of the second phase change layer 54 is etched and removed using the second photoresist pattern PR1 as an etch mask. After the etching, the second phase change layer 54 remains on a portion of the barrier layer 52. FIG. 15 shows the resulting structure after the second photoresist pattern PR1 has been removed.

Figure 16:
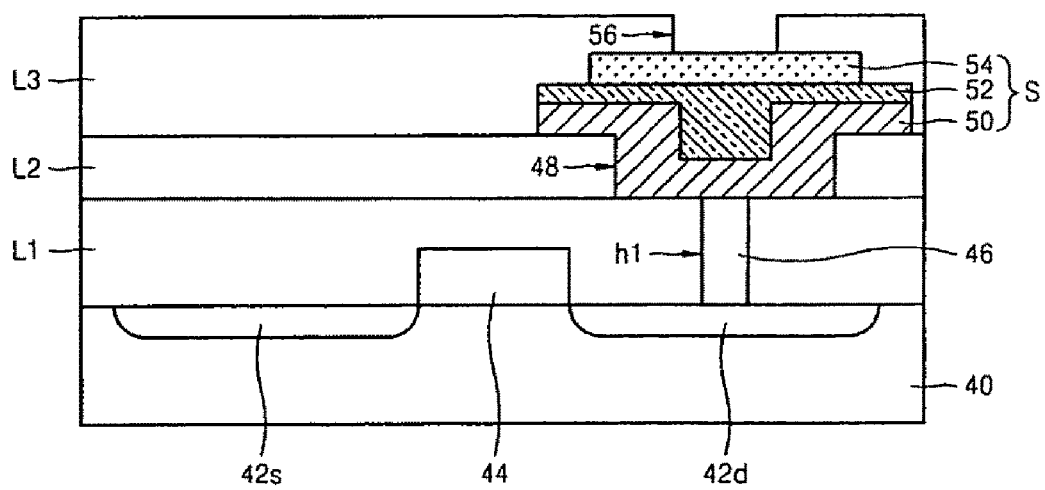

Subsequently, referring to FIG. 16, a third interlayer insulating layer L3 is formed on the second interlayer insulating layer L2 to cover the entire exposed surfaces of the first and second phase change layers 50 and 54 and barrier layer 52. The third interlayer insulating layer L3 may be formed integrally with the second interlayer insulating layer L2. A photo etching process is performed to form a second via hole 56 exposing the second phase change layer 54 in the third interlayer insulating layer L3.

Figure 17:
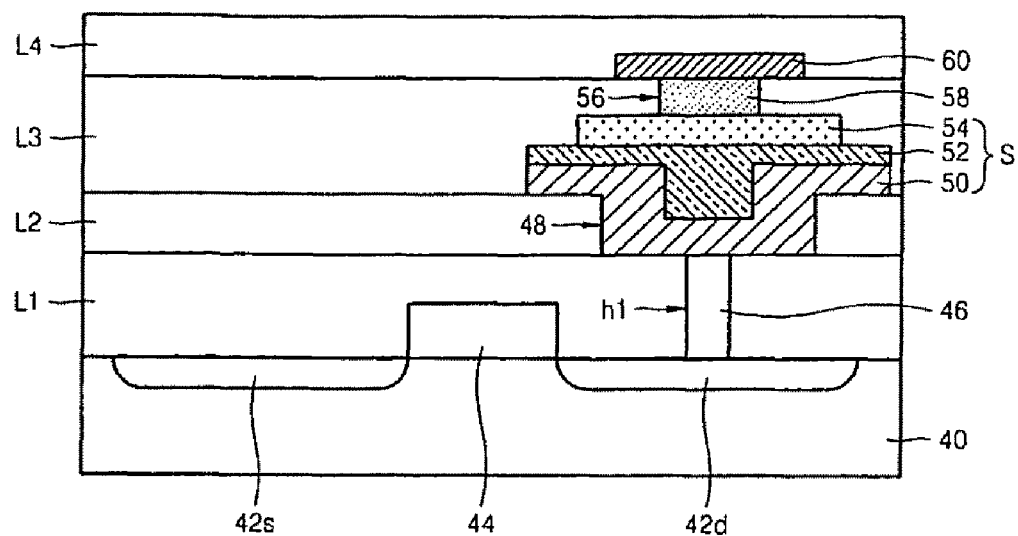

Next, as shown in FIG. 17, after filling the second via hole 56 with a second conductive plug 58, an upper electrode 60 covering the exposed top surface of the second conductive plug 58 is formed on the third interlayer insulating layer L3.

Figure 18:
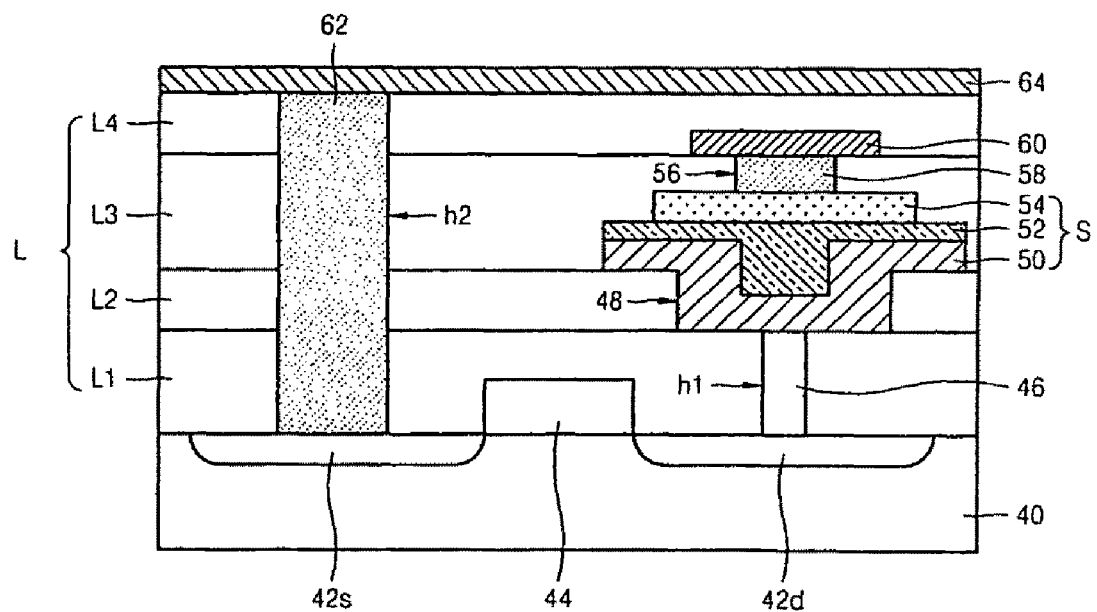

The upper electrode 60 is parallel to the gate stack 44. A fourth interlayer insulating layer L4 covering the upper electrode 60 is formed on the third interlayer insulating layer L3. Subsequently, as shown in FIG. 18, a second contact hole h2 exposing the first impurity region 42s is formed in an interlayer insulating layer L including the first through fourth interlayer insulating layers. L1 through L4 and then filled with a third conductive plug 62. A bit line 64 coupled to the third conductive plug 62 is formed on the fourth interlayer insulating layer L4, thereby completing the memory device of FIG. 2.

During the formation of the barrier layer 52 and the second phase change layer 54, a dielectric layer may-alto, be formed between the barrier layer 52 and the second phase change layer 54, thin enough to induce the tunneling of electrons. FIGS. 19-22 are cross-sectional views of steps of operating (writing and reading data to and from) the multi-bit memory device of FIG. 2 according to an embodiment of the present invention.

Figure 19:
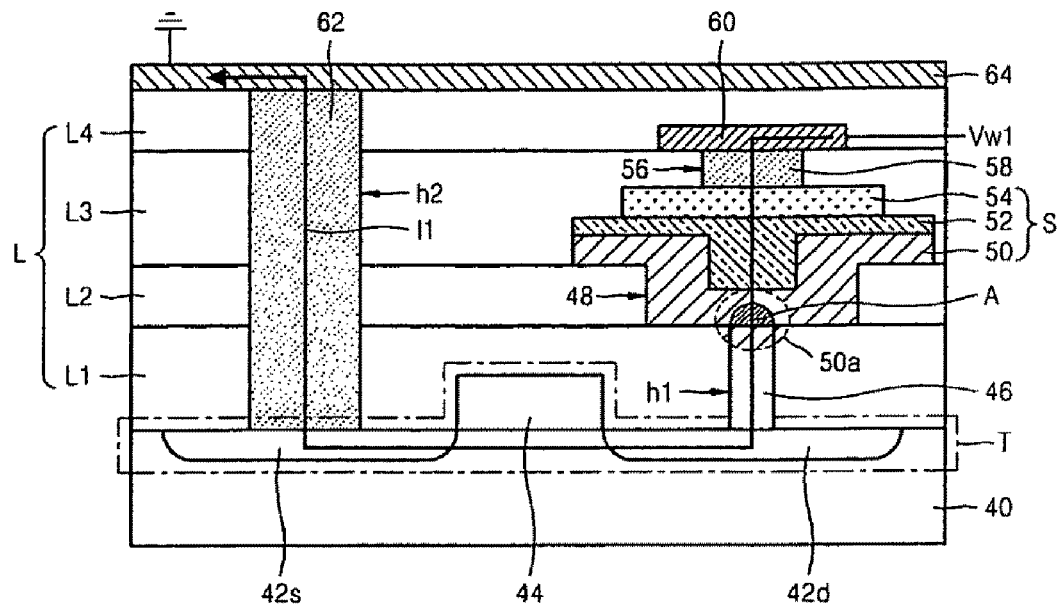
FIGS. 19-22 are cross-sectional views showing steps of operating (writing and reading data to and from) the multi-bit memory device of FIG. 2 according to an embodiment of the present invention.

Referring to FIG. 19, a first write voltage Vw1 is applied between the bit line 64 and the upper electrode 60 when a transistor T is turned on, causing a first current I1 to flow through the first phase change layer 50. The first current I1 changes the phase of a portion of the first phase change layer 50 from a crystalline to an amorphous state. The first write voltage Vw1 is applied for the time required for the portion of the first phase change layer to change from the crystalline to the amorphous state.

As the first current I1 flows through the first phase change layer 50, the temperature of the portion 50a of the first phase change layer 50 in contact with the first conductive plug 46 serving as a lower electrode instantaneously rises above the Curie temperature so that an amorphous region A is formed within the portion 50a of the first phase change layer 50. The first phase change layer 50 having the amorphous region A has a fourth resistance R4 higher than the first resistance R1 of the first phase change layer 50 not containing the amorphous region A. As a result, the resistance R of the storage node S is equal to the sum of the fourth resistance R4 of the first phase change layer 50 and the second resistance R2 that is the minimum resistance of the second phase change layer 54. When the resistance R of the storage node S is R2+R4, one of the four 2-bit data states 00, 01, 10, and 11, for example 01, is considered to have been written to the storage node S.

Figure 20:
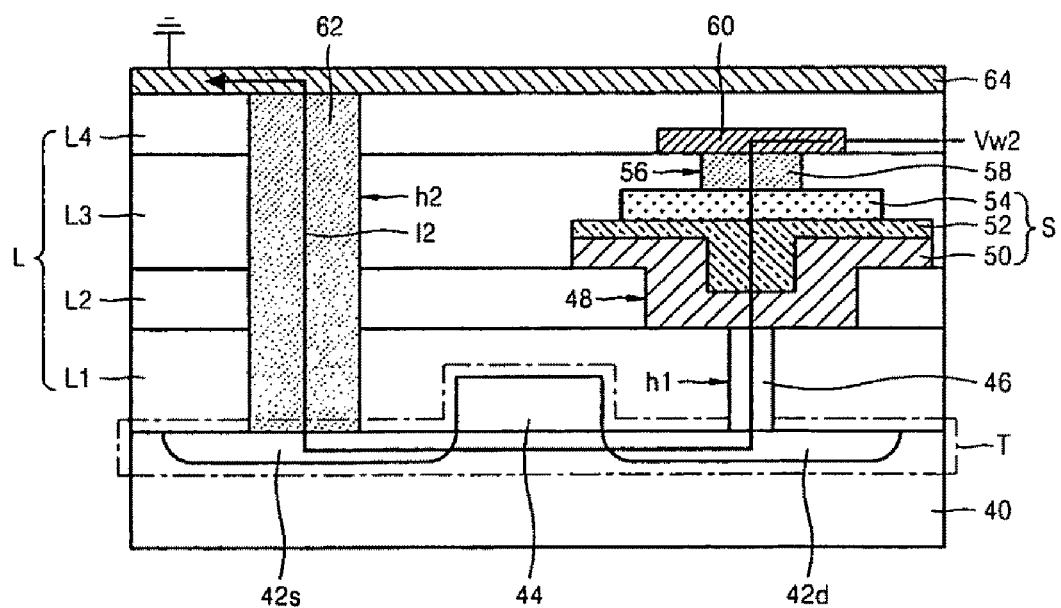

Next, referring to FIG. 20, a second write voltage Vw2 is applied between the bit line 64 and the upper electrode 60 when the transistor T is turned on. The second write voltage Vw2 is a phase change voltage for the second phase change layer 54 and may be lower than the first write voltage Vw1 required to change the first phase change layer 50. Upon the application of the second write voltage Vw2, a second current 12 flows through the second phase change layer 54, causing an increase in the resistance of the second phase change layer 54 from the second resistance R2 to a fifth resistance R5. Thus, the resistance R of the storage node S also increases from R1+R2 to R1+R5. When the resistance R of the storage node S is R1-+R5, one of the four 2-bit data states 00, 01, 10, and 11, for example 10, is considered to have been written to the storage node S.

Figure 21:
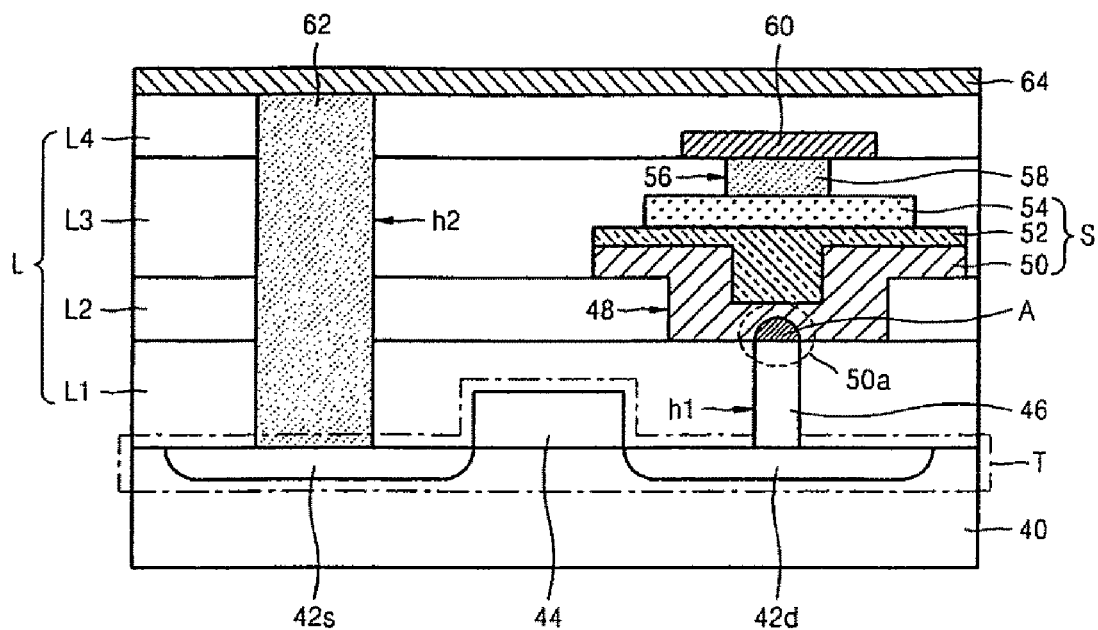

Meanwhile, referring to FIG. 21, when the write operations shown in FIGS. 19 and 20 are sequentially performed, by sequentially applying the first and second write voltages Vw1 and Vw2 across two ends of the storage node S, both the first and second phase change layers 50 and 54 undergo a phase change. The resistance R of the storage node S reaches its maximum value equal to the sum of the fourth and fifth resistances R4 and R5. When the resistance R of the storage node S is R4+R5, one of the four 2-bit data states 00, 01, 10, and 11, for example 1, is considered to have been written to the storage node S.

On the other hand, when the first and second phase change layers 50 and 54 in the storage node S undergo no phase change, and the first and second phase change layers 50 and 54 respectively have the first and second resistances R1 and R2, that are minimum resistances, one of the four 2-bit data states 00, 01, 10, and 11, for example 00, is considered to have been written to the storage node S.

Figure 22:
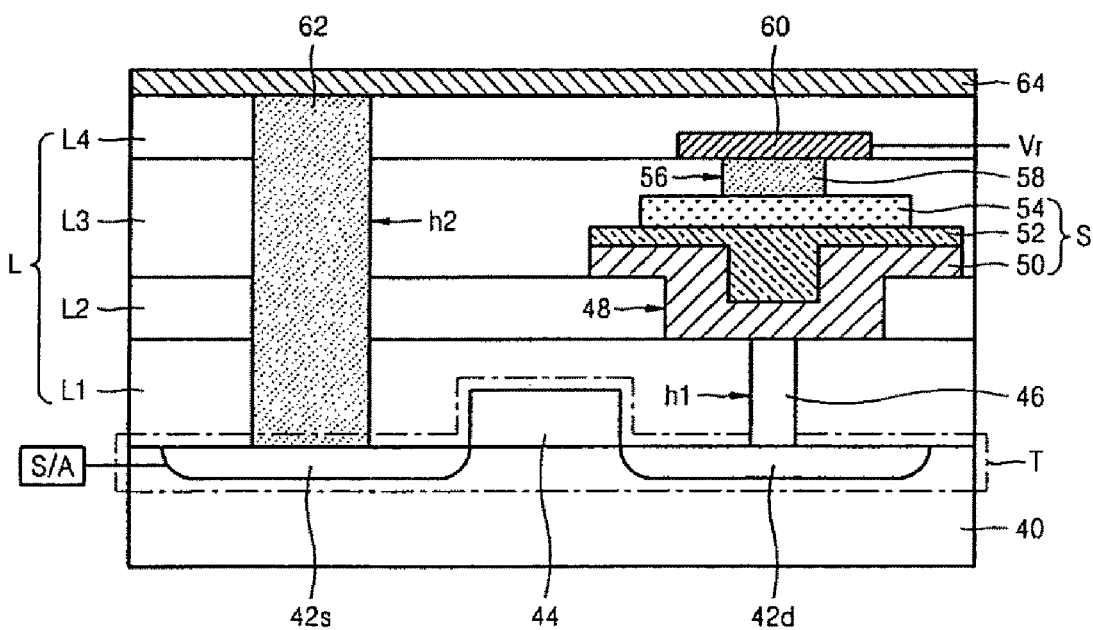

Referring to FIG. 22, a read voltage Vr is applied across the two ends of the storage node S when the transistor T is turned on, causing a current I to flow through the storage node S and the transistor T. The current I is measured by a sense amplifier (S/A) connected to the first impurity region 42s used as the source region of the transistor T. Because the resistance of the storage node S varies according to data written to the storage node S, the current I also varies depending on the data written to the storage node S. Thus, the current I measured by the S/A is used to determine which of the four 2-bit data states 00, 01, 10, and 11 is written to the storage node S. For example, when the current I measured by the S/A is a minimum value, which means the resistance R of the storage node S is a maximum value, R can be determined that 2-bit data '11' has been written to the storage node S during the write, operation. The other 2-bit data states 00, 01 or 10 written to the storage node S can be read in the same manner.

An erase voltage higher than the second write voltage Vw2 (the phase change voltage for the second phase change layer 54) is applied across the two ends of the storage node S for a longer time than when writing data to the first phase change layer 50. The erase voltage may be lower than the first write voltage Vw1 applied to the first phase change layer 50. Data written to the storage node S can be erased all at once or sequentially. In the latter case, for example, data written to the second phase change layer 54 may be erased by applying a voltage higher than the second write voltage Vw while data written to the first phase change layer 50 can be erased by applying a current less than the first current 11 for a longer time than required when the first current 11 is applied. In this case, the data can be erased from the first or second phase change layer 50 or 54.

The invention should not be construed as being limited to the embodiments set forth herein; rather, these embodiments are provided so that this disclosure will be thorough and complete. For example, it will be understood by those of ordinary skill in the art that the storage node S may have various other configurations, and a thin-film transistor (TFT) may be used instead of the field-effect transistor. That is, various changes in form and detail may be made therein without departing from the spirit and scope of the present invention as defined by the following claims.

As described above, the memory device includes a storage node including at least two phase change layers having different phase change characteristics and separated by a barrier layer. The memory device can write at least 2-bit data and uses a lower current for operation. Thus, even when high integration dictates the use of a small transistor with low current rating, the memory device can operate normally.

What is claimed is:

1. A phase change memory device including a storage node, the storage node comprising:
   a lower electrode connected to a substrate;
   a first phase change layer on the lower electrode and having a first minimum resistance and a first maximum resistance based on the application of a first write voltage;
   a first barrier layer overlying the first phase change layer and constituting an insulating layer;
   a second phase change layer overlying the first barrier layer and having a second minimum resistance and a second maximum resistance based on the application of a second write voltage, which is different from the first write voltage; and
   an upper electrode on the second phase change layer,
   wherein the first barrier layer has a lower resistance than the first and second phase change layers and is thin enough to permit the tunneling of electrons.

2. The phase change memory device of claim 1, wherein the first phase change layer is a chalcogenide material.

3. The phase change memory device of claim 1, wherein the second phase change layer is a transition metal oxide.

4. The phase change memory device of claim 3, wherein the first barrier layer is configured to prevent movement of oxygen from the second phase change layer of the transition metal oxide to the first phase change layer.

5. The phase change memory device of claim 1, wherein the storage node further comprises:
   a second barrier layer and a third phase change layer between the second phase change layer and the upper electrode.

6. The phase change memory device of claim 5, wherein the second barrier layer is one of a metal layer and an insulating layer having a lower resistance than the first through third phase change layers and being thin enough to allow the tunneling of electrons.

7. The phase change memory device of claim 1, wherein a resistance of the storage node substantially equals a sum of a resistance of the first phase change layer and a resistance of the second phase change layer.

8. The phase change memory device of claim 1, wherein the first minimum and maximum resistances of the first phase change layer are respectively different from the second minimum and maximum resistances of the second phase change layer.

9. The phase change memory device of claim 1, wherein the second phase change layer is niobium oxide.

10. The phase change memory device of claim 9, wherein the first barrier layer is configured to prevent movement of oxygen from the second phase change layer of niobium oxide to the first phase change layer.

11. The phase change memory device of claim 1, wherein the upper electrode is substantially parallel to a gate electrode of a switching device, the switching device coupled to the storage node.

12. The phase change memory device of claim 1, wherein the first write voltage for causing the first phase change layer to switch between the first minimum resistance and the first maximum resistance is greater than the second write voltage for causing the second phase change layer to switch between the second minimum resistance and the second maximum resistance.

13. The phase change memory device of claim 1, wherein the first barrier layer is configured to prevent the transmission of holes between the first and second phase change layers.

14. A phase change memory device including a storage node, the storage node comprising:
   a lower electrode connected to a substrate;
   a first phase change layer on the lower electrode and having a first minimum resistance and a first maximum resistance based on the application of a first write voltage;
   a first barrier layer overlying the first phase change layer;
   a second phase change layer overlying the first barrier layer and having a second minimum resistance and a second maximum resistance based on the application of a second write voltage, which is different from the first write voltage;
   an upper electrode on the second phase change layer; and
   a dielectric layer that is between the second phase change layer and the upper electrode and is thin enough to allow the tunneling of electrons.

15. The phase change memory device of claim 14, wherein the first phase change layer is a chalcogenide material.

16. The phase change memory device of claim 14, wherein the first barrier layer is one of a metal layer and an insulating layer having a lower resistance than the first and second phase change layers and being thin enough to permit the tunneling of electrons.

17. The phase change memory device of claim 14, wherein the second phase change layer is a transition metal oxide.

18. The phase change memory device of claim 14, wherein the storage node further comprises:
   a second barrier layer and a third phase change layer between the second phase change layer and the upper electrode.

19. The phase change memory device of claim 18, wherein the second barrier layer is one of a metal layer and an insulating layer having a lower resistance than the first through third phase change layers and being thin enough to allow the tunneling of electrons.

20. The phase change memory device of claim 14, wherein the first minimum and maximum resistances of the first phase change layer are respectively different from the second minimum and maximum resistances of the second phase change layer.

21. The phase change memory device of claim 14, wherein the second phase change layer is niobium oxide.

* * * * *